United States Patent
He et al.

(10) Patent No.: US 9,997,627 B2
(45) Date of Patent: Jun. 12, 2018

(54) VERTICAL CHANNEL OXIDE SEMICONDUCTOR FIELD EFFECT TRANSISTOR AND METHOD FOR FABRICATING THE SAME

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/709,450

(22) Filed: Sep. 19, 2017

(65) Prior Publication Data

US 2018/0102434 A1    Apr. 12, 2018

Related U.S. Application Data

(63) Continuation of application No. 15/289,982, filed on Oct. 11, 2016, now Pat. No. 9,806,191.

(51) Int. Cl.
| | |
|---|---|
| *H01L 29/10* | (2006.01) |
| *H01L 29/12* | (2006.01) |
| *H01L 29/78* | (2006.01) |
| *H01L 29/24* | (2006.01) |
| *H01L 21/467* | (2006.01) |
| *H01L 21/441* | (2006.01) |
| *H01L 29/423* | (2006.01) |
| *H01L 29/08* | (2006.01) |
| *H01L 29/66* | (2006.01) |

(52) U.S. Cl.
CPC ........ *H01L 29/7827* (2013.01); *H01L 21/441* (2013.01); *H01L 21/467* (2013.01); *H01L 29/0847* (2013.01); *H01L 29/1037* (2013.01); *H01L 29/24* (2013.01); *H01L 29/42364* (2013.01); *H01L 29/66969* (2013.01)

(58) Field of Classification Search
USPC .................. 257/135–136, 242, 329, E27.091, 257/E27.095–E27.096, E29.118, E29.274, 257/E29.313, E29.318, E29.262; 438/135–136, 242, 329, 137, 156, 173, 438/192, 206, 212
See application file for complete search history.

(56) References Cited

U.S. PATENT DOCUMENTS

| | | |
|---|---|---|
| 7,230,286 B2 | 6/2007 | Cohen et al. |
| 7,402,483 B2 | 7/2008 | Yun |
| 8,168,508 B2 | 5/2012 | Chu-Kung et al. |

(Continued)

OTHER PUBLICATIONS

Zhou, Title of Invention: Semiconductor Structure, U.S. Appl. No. 14/724,799, filed May 28, 2015.

*Primary Examiner* — Tram H Nguyen
(74) *Attorney, Agent, or Firm* — Winston Hsu

(57) ABSTRACT

A semiconductor device includes: a channel layer surrounded by a source layer; a first dielectric layer around the source layer; a gate layer around the channel layer and on the source layer; a first oxide semiconductor layer between the gate layer and the channel layer; a second oxide semiconductor layer between the gate layer and the drain layer; a second gate dielectric layer between the second oxide semiconductor layer and the drain layer; a drain layer on the gate layer and around the channel layer; and a second dielectric layer around the drain layer.

10 Claims, 6 Drawing Sheets

(56) References Cited

U.S. PATENT DOCUMENTS

| | | | |
|---|---|---|---|
| 8,575,686 B2* | 11/2013 | Masuoka | H01L 27/11521 |
| | | | 257/321 |
| 8,946,670 B1 | 2/2015 | Park | |
| 2013/0009219 A1* | 1/2013 | Yamazaki | H01L 29/7869 |
| | | | 257/288 |
| 2013/0093000 A1 | 4/2013 | Guo | |
| 2015/0014680 A1 | 1/2015 | Yamazaki | |
| 2015/0333078 A1* | 11/2015 | Colinge | H01L 21/28282 |
| | | | 257/316 |
| 2016/0005850 A1* | 1/2016 | Zhao | H01L 29/781 |
| | | | 257/329 |
| 2017/0077304 A1* | 3/2017 | Obradovic | H01L 29/78681 |

* cited by examiner

US 9,997,627 B2

VERTICAL CHANNEL OXIDE SEMICONDUCTOR FIELD EFFECT TRANSISTOR AND METHOD FOR FABRICATING THE SAME

CROSS REFERENCE TO RELATED APPLICATIONS

This is a continuation application of U.S. patent application Ser. No. 15/289,982, filed on Oct. 11, 2016, and all benefits of such earlier application are hereby claimed for this new continuation application.

BACKGROUND OF THE INVENTION

1. Field of the Invention

The invention relates to a method for fabricating semiconductor device, and more particularly to a method for fabricating a vertical channel oxide semiconductor field-effect transistor (OSFET).

2. Description of the Prior Art

Attention has been focused on a technique for formation of a transistor using a semiconductor thin film formed over a substrate having an insulating surface. The transistor is used in a wide range of electronic devices such as an integrated circuit (IC) and an image display device (display device). A silicon-based semiconductor material is widely known as a material for a semiconductor thin film applicable to a transistor, and within which, oxide semiconductor containing indium (In), gallium (Ga), and zinc (Zn) has been attracting attention.

Conventional oxide semiconductor field effect transistors mostly have what is called a planar structure, in which elements such as oxide semiconductor layer and gate electrode are stacked over a plane. With advances in manufacturing process which enables miniaturization of such devices, various problems such as increase in short-channel effect and leakage current arise. Hence, how to effectively improve the drawbacks of current OSFETs have become an important task in this field.

SUMMARY OF THE INVENTION

According to a preferred embodiment of the present invention, a method for fabricating semiconductor device is disclosed. The method includes the steps of: providing a source layer; removing part of the source layer to form a first opening; forming a first channel layer in the first opening; forming a gate layer around the first channel layer and on the source layer; forming a drain layer on the gate layer and the first channel layer; removing part of the drain layer to form a second opening; and forming a second channel layer in the second opening.

According to another aspect of the present invention, a semiconductor device is disclosed. The semiconductor device includes: a channel layer surrounded by a source layer; a gate layer around the channel layer and on the source layer; and a drain layer on the gate layer and around the channel layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
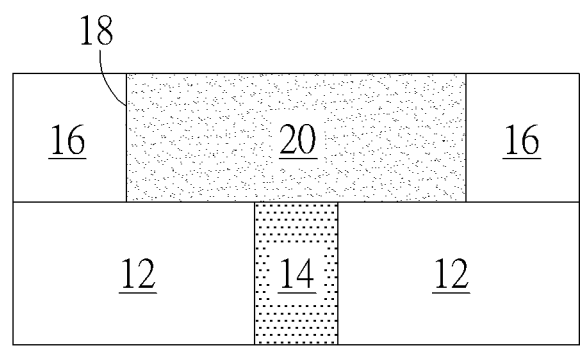
FIGS. 1-10 illustrate a method for fabricating a vertical channel oxide semiconductor field effect transistor (OSFET) according to an embodiment of the present invention.

Referring to FIGS. 1-10, FIGS. 1-10 illustrate a method for fabricating a vertical channel oxide semiconductor field effect transistor (OSFET) according to an embodiment of the present invention. As shown in FIG. 1, a substrate (not shown) is first provided, in which the substrate could be a semiconductor substrate including but not limited to, for example a silicon substrate, an epitaxial silicon substrate, a silicon carbide (SiC) substrate, or a silicon-on-insulator (SOI) substrate.

Next, a dielectric layer 12 is formed on the substrate, a photo-etching process is conducted to remove part of the dielectric layer for forming an opening (not shown), and a conductive layer 14 or metal layer is formed to fill the opening completely. A planarizing process such as chemical mechanical polishing (CMP) process is then conducted to remove part of the conductive layer 14 so that the top surfaces of the conductive layer 14 and dielectric layer 12 are coplanar. Preferably, the patterned conductive layer 14 serves as a lower contact extension for the vertical channel OSFET, in which the patterned conductive layer 14 may be electrically connected to other interconnections or active devices on the substrate.

Next, another dielectric layer 16 is formed on the dielectric layer 12 and the conductive layer 14, and steps for forming the conductive layer 14 could be repeated by conducting another photo-etching process to remove part of the dielectric layer 16 for forming an opening 18 exposing the conductive layer 14 underneath, forming another conductive layer or a source layer 20 on the dielectric layer 16 and into the opening 18, and planarizing part of the source layer 20 so that the top surface of the remaining source layer 20 is even with the top surface of the dielectric layer 16.

It should be noted that even though the conductive layer 14 and the source layer 20 are formed into the dielectric layers 12, 16 through two separate photo-etching processes, it would also be desirable to combine the formation of these two layers 14 and 20 via a dual damascene process. For instance, according to an embodiment of the present invention, it would be desirable to form a single dielectric layer (not shown) on the substrate, conduct a dual damascene process to form a trench (not shown) and a via (not shown) in the dielectric layer, form a conductive layer into the trench and the via at the same time and then planarize the deposited conductive layer thereafter. In this approach, the conductive layer 14 and source layer 20 are formed within a single dielectric layer instead of two, and since a dual damascene process is well known to those skilled in the art in this field, the details of which are not explained herein for the sake of brevity.

The conductive layer 14 and the source layer 20 are preferably made of same material, but could also be made of different material depending on the demand of the product. In this embodiment, the conductive layer 14 and the source layer 20 are preferably made of element selected from aluminum, chromium, copper, tantalum, titanium, molybdenum, tungsten, an alloy containing any of these elements as a component, or combination thereof. Furthermore, one or more materials selected from manganese, magnesium, zirconium, beryllium, and thorium may be used. Aluminum combined with one or more of elements selected from titanium, tantalum, tungsten, molybdenum, chromium, neodymium, and scandium may be used.

In addition, the conductive layer 14 and the source layer 20 can have a single-layer structure or a layered structure including two or more layers. For example, the conductive layer 14 and source layer 20 can have a single-layer structure of an aluminum film containing silicon, a two-layer structure in which a titanium film is stacked over an aluminum film, or a three-layer structure in which a titanium film, an aluminum film, and a titanium film are stacked in that order. It should be noted that if multi-layer design were chosen to form the conductive layer 14 and the source layer 20, the formation of the conductive layer 14 and source layer 20 could be accomplished by using the same approach disclosed above and by doing so, the material layers within the resulting conductive layer 14 and source layer 20 would reveal a U-shaped cross-section except the most top layer.

Figure 2:
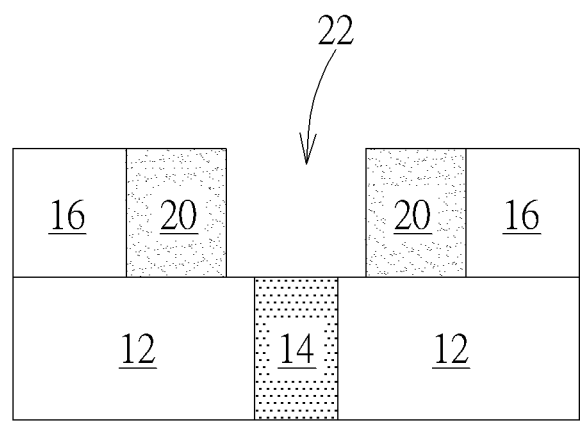

Next, as shown in FIG. 2, a photo-etching process is conducted to remove part of the source layer 20 to form an opening 22, in which the opening 22 exposes part of the dielectric layer 12 and part of the conductive layer 14 underneath.

Figure 3:
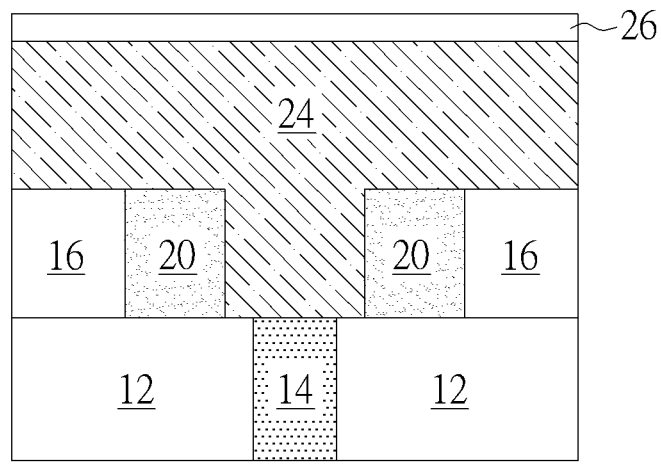

Next, as shown in FIG. 3, a channel layer 24 or an oxide semiconductor (OS) layer is formed on the dielectric layer 16 and source layer 20 and filled into the opening 22, and a hard mask 26 is formed on the channel layer 24 thereafter.

In this embodiment, the OS layer or channel layer 24 is preferably selected from the group consisting of indium gallium zinc oxide (IGZO), indium aluminum zinc oxide, indium tin zinc oxide, indium aluminum gallium zinc oxide, indium tin aluminum zinc oxide, indium tin hafnium zinc oxide, and indium hafnium aluminum zinc oxide, and the hard mask 26 could be selected from dielectric material consisting of silicon oxide, silicon nitride, SiON, and SiCN, but not limited thereto.

Figure 4:
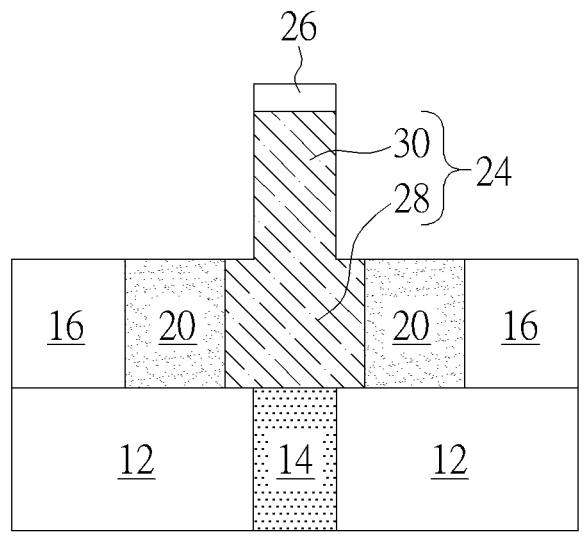

Next, as shown in FIG. 4, a photo-etching process is conducted to remove part of the hard mask 26 and part of the channel layer 24 to expose the dielectric layer 16 and the source layer 20 underneath. Specifically, the channel layer 24 is patterned into a reverse T-shaped structure, in which the remaining channel layer 24 includes a horizontal portion 28 sandwiched between the source layer 20 and a vertical portion 30 elongated upward from the horizontal portion 28. While the width of the horizontal portion 28 is slightly greater than the width of the conductive layer 14 embedded within the dielectric layer 12, the width of the remaining hard mask 26 and the vertical portion 30 after the photo-etching process is substantially the same as the width of the conductive layer 14.

Figure 5:
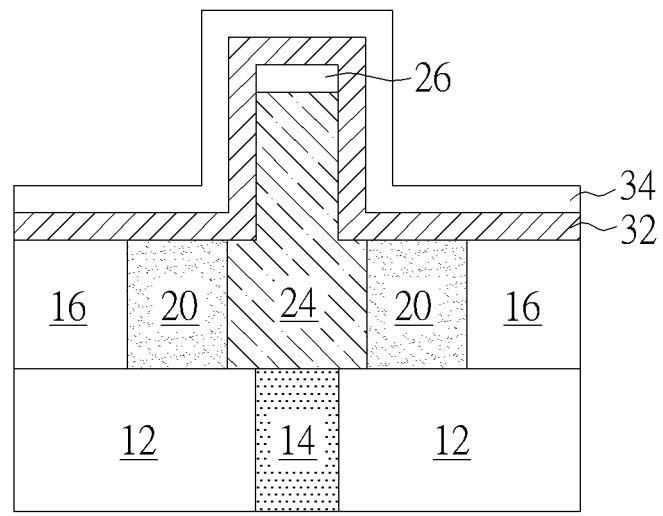

Next, as shown in FIG. 5, another OS layer 32 is conformally deposited on the dielectric layer 16, the source layer 20, the channel layer 24, and the hard mask 26, in which the OS layer 32 and the channel layer 24 could be made of same material or different material. Next, a gate dielectric layer 34 is formed on the OS layer 32, in which the gate dielectric layer 34 is preferably made of silicon oxide.

According to an embodiment of the present invention, the gate dielectric layer 34 could also include a high-k dielectric layer selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Figure 6:
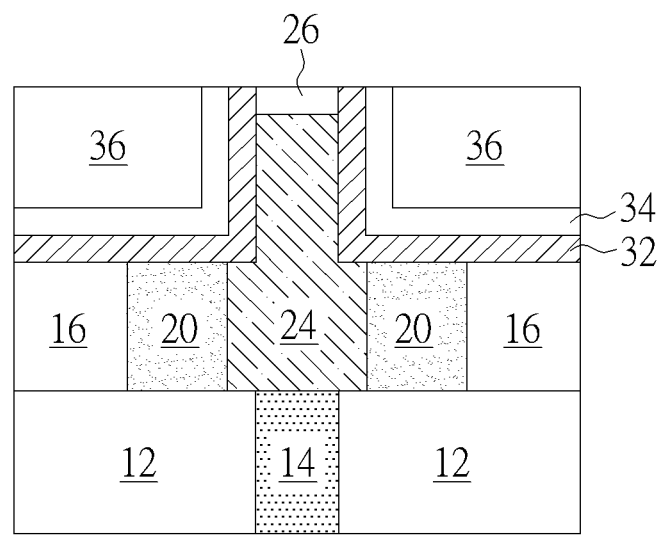

Next, as shown in FIG. 6, a gate layer 36 is formed on the gate dielectric layer 34, and an etching process or a planarizing process such as CMP is conducted to remove part of the gate layer 36, part of the gate dielectric layer 34, and part of the OS layer 32 so that the top surfaces of the gate layer 36, the gate dielectric layer 34, the OS layer 32, and the hard mask 26 are coplanar. This forms a gate structure or gate layer 36 around the channel layer 24 and both the gate dielectric layer 34 and OS layer 32 sitting on two sides of the channel layer 24 now include a L-shaped and/or reverse L-shaped cross-section. In this embodiment, the gate layer 36 could be a polysilicon gate made of polysilicon or a metal gate made of work function metal layer and low resistance metal layer.

According to an embodiment of the present invention, if a metal gate were to be fabricated, it would also be desirable to sequentially deposit a work function metal layer (not shown), an optional barrier layer, and a low resistance metal layer directly on the gate dielectric layer 34, and then perform a planarizing process to remove part of the low resistance metal layer, part of the barrier layer, and part of the work function metal layer to form a metal gate around the channel layer 24.

The work function metal layer is formed for tuning the work function of the gate structure to be adaptable in an NMOS or a PMOS. For an NMOS transistor, the work function metal layer having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), titanium aluminum carbide (TiAlC), or combination thereof, but not limited thereto. For a PMOS transistor, the work function metal layer having a work function ranging between 4.8 eV and 5.2 eV may include titanium nitride (TiN), tantalum nitride (TaN), tantalum carbide (TaC), or combination thereof, but not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

Figure 7:
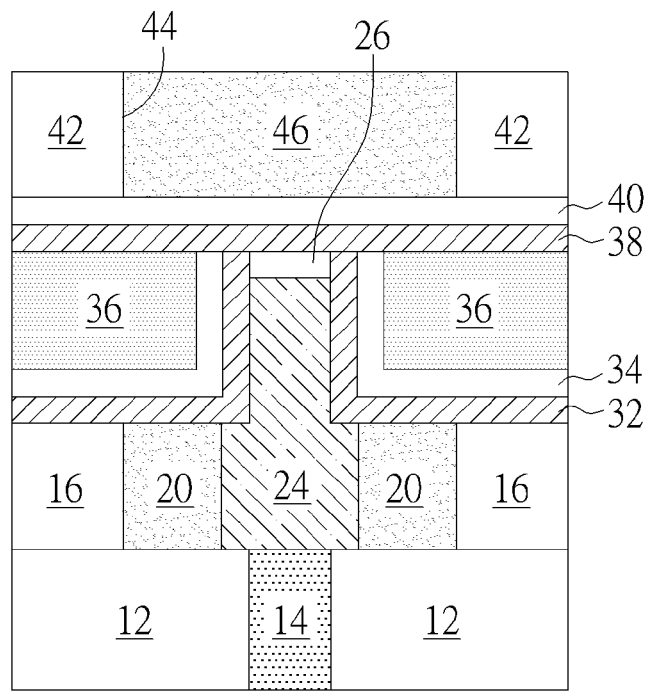

Next, as shown in FIG. 7, another OS layer 38 and gate dielectric layer 40 are sequentially formed on the gate layer 36 and the hard mask 26, and a dielectric layer 42 is formed on the gate dielectric layer 40 thereafter. Preferably, the OS layer 38 and the OS layer 32 could be made of same material and the gate dielectric layer 40 and the gate dielectric layer 34 could be made of same material.

Next, a photo-etching process is conducted to remove part of the dielectric layer 42 for forming an opening 44 exposing part of the gate dielectric layer 40, a drain layer 46 made of conductive material is formed on the patterned dielectric layer 42 and filled into the opening 44 completely. A planarizing process such as CMP is then conducted to remove part of the drain layer 46 so that the top surfaces of the drain layer 46 and dielectric layer 42 are coplanar.

Preferably, the drain layer 46 and the source layer 20 are made of same material, but could also be made of different material depending on the demand of the product. Similar to the material disclosed for the source layer 20, the drain layer 46 could be made of element selected from aluminum, chromium, copper, tantalum, titanium, molybdenum, tungsten, an alloy containing any of these elements as a component, or combination thereof. Furthermore, one or more materials selected from manganese, magnesium, zirconium, beryllium, and thorium may be used. Aluminum combined with one or more of elements selected from titanium, tantalum, tungsten, molybdenum, chromium, neodymium, and scandium may be used.

Figure 8:
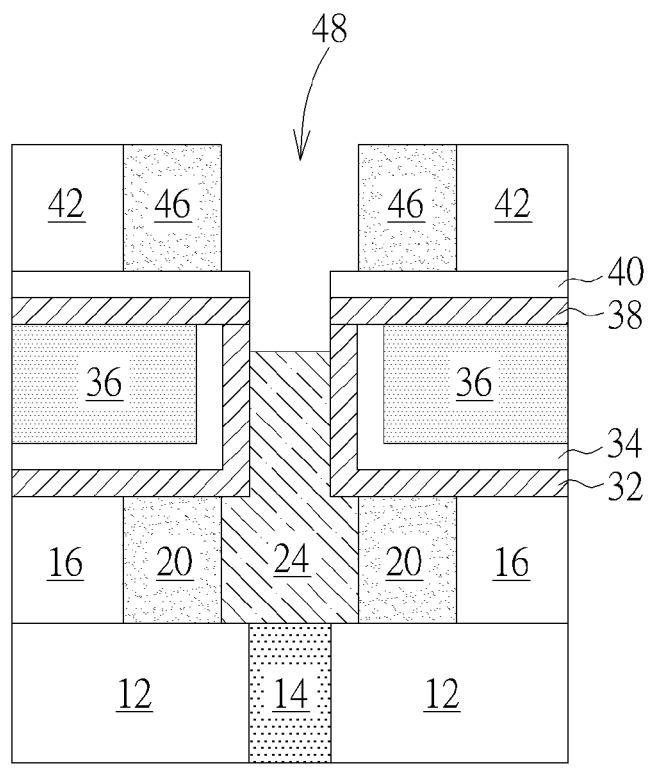

Next, as shown in FIG. 8, another photo-etching process is conducted by using a patterned resist (not shown) as mask to remove part of the drain layer 46, part of the gate dielectric layer 40, part of the OS layer 38, and the hard mask 26 completely. This forms another opening 48 to expose the channel layer 24 underneath.

Figure 9:
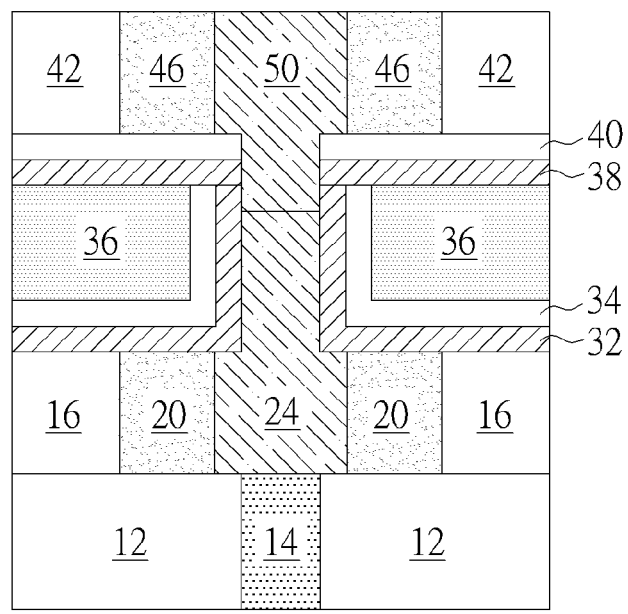

Next, as shown in FIG. 9, another channel layer 50 or OS layer is formed on the dielectric layer 42 and filled into the opening 48 completely, and a planarizing process such as CMP is conducted to remove part of the channel layer 50 so that the top surfaces of the channel layer 50 and the drain layer 46 are coplanar. Preferably, the channel layer 50 and the channel layer 24 underneath are made of same material so that the two channel layers 24 and 50 together constitute a channel for the vertical OSFET.

Figure 10:
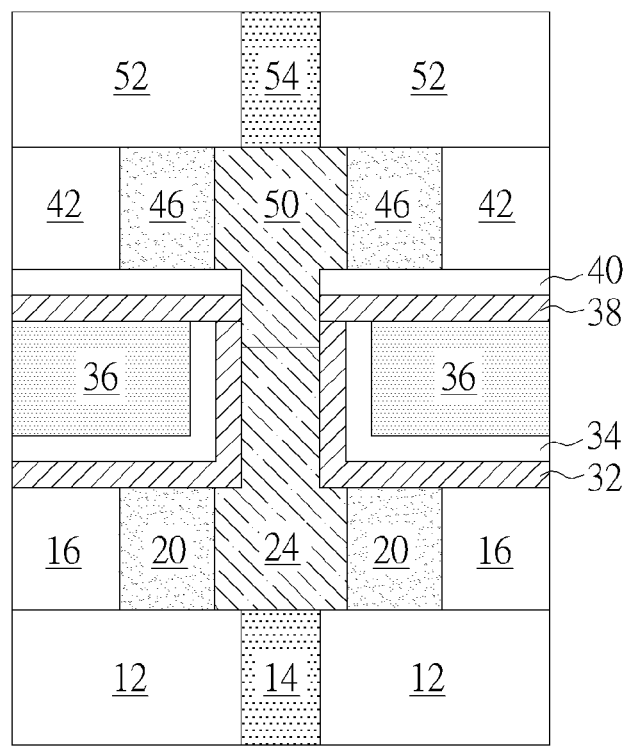

Next, as shown in FIG. 10, a dielectric layer 52 is formed on the dielectric layer 42, drain layer 46, and channel layer 50, and a photo-etching process is conducted to remove part of the dielectric layer 52 for forming an opening (not shown). Next, a conductive layer 54 is formed on the dielectric layer 52 and filled into the opening completely, and a planarizing process such as CMP is conducted to remove part of the conductive layer 54 so that the top surfaces of the conductive layer 54 and dielectric layer 52 are coplanar. Preferably, the conductive layer 54 and the conductive layer 14 connecting to other end of the channel layer 24 are made of same material, in which the conductive layer 14 preferably serves as a top contact extension for the vertical channel OSFET. This completes the fabrication of a vertical channel OSFET according to a preferred embodiment of the present invention.

Referring again to FIG. 10, FIG. 10 further illustrates a structural view of a vertical channel OSFET according to a preferred embodiment of the present invention. As shown in FIG. 10, the vertical channel OSFET includes channel layers 24 and 50, in which the channel layers 24 and 50 are surrounded by a source layer 20, a gate layer 36, and a drain layer 46 at the same time. Specifically, the horizontal portion 28 of the channel layer 24 is surrounded by the source layer 20, the vertical portion 30 is surrounded by the gate layer 36, and the channel layer 50 is surrounded by the drain layer 46. A OS layer 32 and a gate dielectric layer 34 are also disposed between the gate layer 36 and the vertical portion 30 of the channel layer 24, in which the OS layer 32 and gate dielectric layer 34 could either be L-shaped and/or reverse L-shaped.

Figure 11:
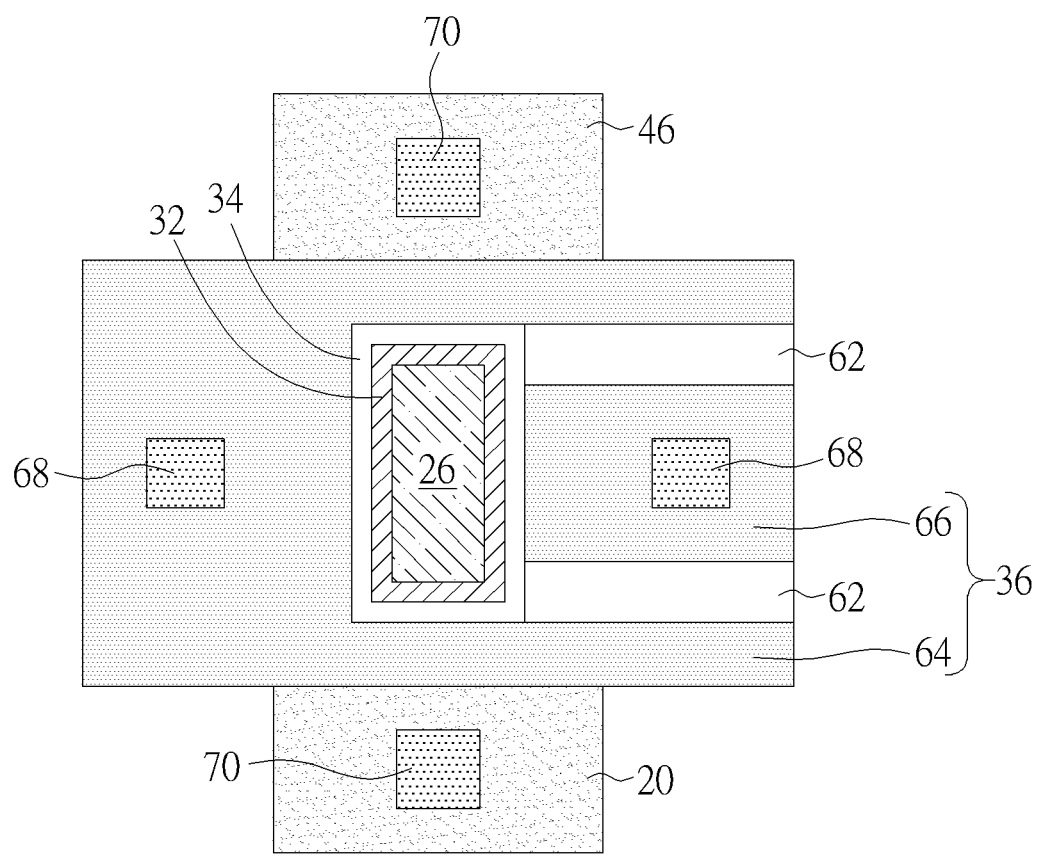
FIG. 11 illustrates a schematic view for fabricating a dual gate vertical channel OSFET according to an embodiment of the present invention.

Referring to FIG. 11, FIG. 11 illustrates a schematic view for fabricating a dual gate vertical channel OSFET according to an embodiment of the present invention. As shown in FIG. 11, after the gate dielectric layer 34 is formed as disclosed in FIG. 5, it would be desirable to first form a patterned dielectric layer 62 adjacent to the gate dielectric layer 34 for defining the relative location of a front gate and a back gate to be formed, and then form a gate layer 36 around the channel layer 24 and the hard mask 26 atop. Preferably, the gate layer 36 is separated by the patterned dielectric layer 62 into two portions, in which the greater portion surrounding the channel layer 24 and hard mask 26 is defined into a front gate 64 while the lesser portion placed between the patterned dielectric layer 62 is defined into a back gate 66. The channel layer 24 under the hard mask 26 is also surrounded by a source layer 20 and a drain layer 46, and contact plugs 70 may be formed to electrically connect the source layer 20 and drain layer 46 and contact plugs 68 may be formed to electrically connect the front gate 64 and back gate 66.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising: a channel layer surrounded by a source layer, wherein a bottom surface of the channel layer is even with a bottom surface of the source layer; a gate layer around the channel layer and on the source layer; and a drain layer on the gate layer and around the channel layer;
a first oxide semiconductor layer between the gate layer and the channel layer; wherein the first oxide semiconductor layer is L-shaped.

2. The semiconductor device of claim 1, further comprising a first dielectric layer around the source layer.

3. The semiconductor device of claim 2, wherein the bottom surfaces of the first dielectric layer, the source layer, and the channel layer are coplanar.

4. The semiconductor device of claim 1, further comprising a first gate dielectric layer between the first oxide semiconductor layer and the gate layer.

5. The semiconductor device of claim 4, wherein the first gate dielectric layer is L-shaped.

6. The semiconductor device of claim 4, wherein the top surfaces of the gate layer, the first gate dielectric layer, and the first oxide semiconductor layer are coplanar.

7. The semiconductor device of claim 1, further comprising an oxide semiconductor layer between the gate layer and the drain layer.

8. The semiconductor device of claim 7, further comprising a gate dielectric layer between the oxide semiconductor layer and the drain layer.

9. The semiconductor device of claim 1, further comprising a dielectric layer around the drain layer.

10. The semiconductor device of claim 9, wherein the top surfaces of the dielectric layer, the drain layer, and the channel layer are coplanar.

* * * * *